(12) United States Patent
Liaw

(10) Patent No.: US 9,024,392 B2
(45) Date of Patent: May 5, 2015

(54) MULTI-PORT SRAM MANUFACTURING

(71) Applicant: Taiwan Semiconductor Manufacturing Co., Ltd., Hsin-Chu (TW)

(72) Inventor: Jhon Jhy Liaw, Zhudong Township (TW)

(73) Assignee: Taiwan Semiconductor Manufacturing Co., Ltd., Hsin-Chu (TW)

(*) Notice: Subject to any disclaimer, the term of this patent is extended or adjusted under 35 U.S.C. 154(b) by 0 days.

(21) Appl. No.: 13/934,285

(22) Filed: Jul. 3, 2013

(65) Prior Publication Data

US 2015/0008533 A1 Jan. 8, 2015

(51) Int. Cl.
*H01L 27/088* (2006.01)
*H01L 27/11* (2006.01)
(52) U.S. Cl.
CPC .................. *H01L 27/1104* (2013.01)
(58) Field of Classification Search
USPC ................................................. 257/288–392
See application file for complete search history.

(56) References Cited

U.S. PATENT DOCUMENTS

2010/0193840 A1* 8/2010 Doyle et al. ............... 257/192
2013/0224936 A1* 8/2013 Lee et al. ................... 438/492

* cited by examiner

*Primary Examiner* — Mamadou Diallo
(74) *Attorney, Agent, or Firm* — Eschweiler & Associates, LLC

(57) ABSTRACT

Some embodiments relate to an integrated circuit including fin field effect transistors (FinFETs) thereon. The integrated circuit includes first and second active fin regions having a first conductivity type and spaced apart from one another. A gate dielectric layer is disposed over the first and second active fin regions. First and second gate electrodes are disposed over the first and second active fin regions, respectively. The first and second gate electrodes are also disposed over the gate dielectric layer. The first and second gate electrodes are electrically coupled together and are electrically separated from the first and second active fin regions by the gate dielectric layer. The first gate electrode is made of a first metal having a first workfunction, and the second gate electrode is made of a second metal having a second workfunction that differs from the first workfunction.

20 Claims, 5 Drawing Sheets

US 9,024,392 B2

MULTI-PORT SRAM MANUFACTURING

BACKGROUND

FinFET devices are being used to improve device performance, particularly in technologies where the smallest features are 20 nm or smaller. Memory, such as static random access memory (SRAM) for example, is one application where FinFETs can be deployed. In the memory area, the small feature sizes provided by FinFETs allows devices to be densely packed together to achieve correspondingly dense data storage.

The present disclosure provides techniques that can alter the voltage thresholds of FinFET devices to suit a desired application. One such application is low-power memory (e.g., SRAM), where different voltage thresholds can help achieve a particularly good balance of reliable read operations and fast write operations.

DETAILED DESCRIPTION

Figure 1:
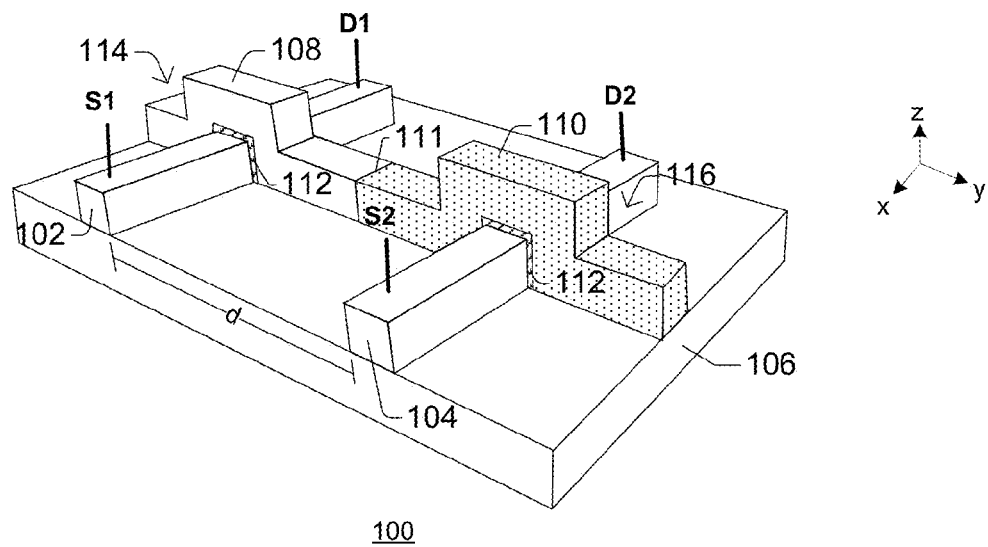
FIG. 1 shows a perspective view of some embodiments of FinFET devices with different metal gate electrodes.

The claimed subject matter is now described with reference to the drawings, wherein like reference numerals are used to refer to like elements throughout. In the following description, for purposes of explanation, numerous specific details are set forth in order to provide a thorough understanding of the claimed subject matter. It may be evident, however, that the claimed subject matter may be practiced without these specific details.

To reduce power consumption in SRAM, it is desirable to use the lowest possible VCC for data cache and instruction cache cells (e.g., L1 cells). To lower power consumption, 2-port SRAM cells have been manufactured with planar MOSFET devices. Each two-port SRAM cell can include a read port and a separate write port, such that different bias conditions can be applied to the two ports. For example, a lower VCC can be applied to the write port for cell stability, while a higher current (Ion) can be applied to the read port for fast read operations.

To improve the speed/reliability tradeoffs when two-port SRAMs are made with FinFETs, it would be advantageous to reduce the voltage threshold ($V_T$) of the read-port FinFET transistors (for lower power read operations which are still fast) while leaving the voltage threshold of the write-port FinFET transistors at a higher $V_T$ (for high data stability and low leakage). To have a higher $V_T$ FinFET, one option would be to use extremely high doping (e.g., approximately 3-10 times higher than conventional planar devices). However, due to their thin body/channel region, FinFETs have less channel dopant sensitivity and correspondingly limited $V_T$ tuning. Thus, use of extremely high doping would dramatically increase mismatch between devices, potentially causing operation failure at SRAM minimum voltages.

In view of these shortcomings, some embodiments of the present disclosure relate to improved techniques for semiconductor manufacturing that use at least two different workfunction metals for gate electrodes for FinFETs of the same conductivity type. For example, two or more n-type FinFETs can be made with metal gate electrodes having different work-functions, and/or two or more p-type transistors can be made with metal gate electrodes having different work functions. Using metal gate electrodes with different work functions generates different threshold voltages for the corresponding FinFETs. In the context of N-port SRAM (N is greater than or equal to two), write port devices can use metal gate electrodes that induce higher $V_T$'s (lower leakage), while read port devices can use metal gate electrodes that induce lower $V_T$ (faster read operations at lower power).

FIG. 1 shows a perspective view of a portion of an integrated circuit 100 in accordance with some embodiments. The integrated circuit 100 includes first and second active fin regions 102, 104, which extend upward from a semiconductor substrate 106. The first and second active fin regions 102, 104 have a first conductivity type (e.g., n-type) and are spaced apart from one another by distance, d. First and second gate electrodes 108, 110, respectively, which are electrically coupled at interface 111, extend over the first and second active fin regions, 102, 104, respectively. A dielectric layer 112, such as a low-k dielectric, separates the first and second active fin regions 102, 104 from the first and second gate electrodes 108, 110. Source and drain regions, which have a second conductivity type (e.g., p-type), are formed within the active fin regions about opposite sides of the gate electrodes. Thus, to establish a first FinFET 114, first source region S1 and first drain region D1 are formed in first active fin region 102 on opposite sides of first gate electrode 108. Similarly, to establish a second FinFET 116, second source region S2 and second drain region D2 are formed in second active fin region 104 on opposite sides of second gate electrode 110.

Notably, to tune the threshold voltages of the first and second FinFETs 114, 116, the first gate electrode 108 is made of a first metal having a first work function, while the second gate electrode 110 is made of a second, different metal having a second work function that is different from the first work function. The first and second metals abut one another at interface 111 such that the first and second gate electrodes are electrically coupled to one another. By selecting suitable metals for the first and second gate electrodes 108, 110, a designer can set the threshold voltages of the first and second FinFETs 114, 116 to meet the demands of a desired application.

Figure 2:
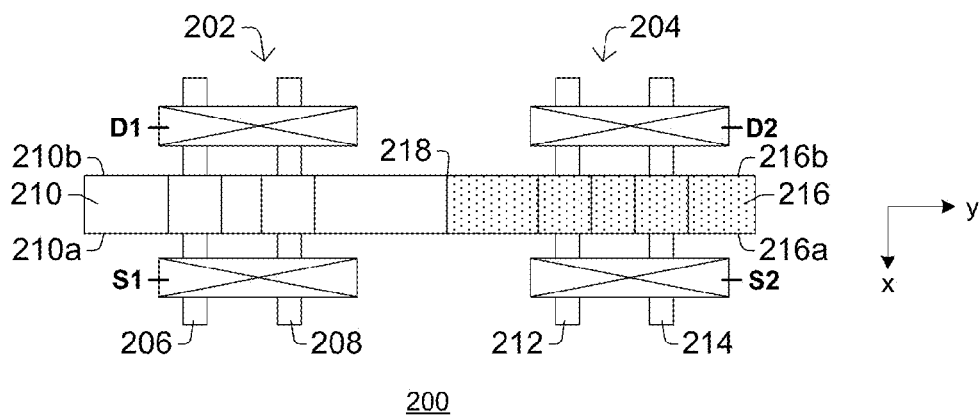
FIG. 2 shows a top view of some embodiments of FinFET devices with different metal gate electrodes and with separate sources and separate drains.

FIG. 2 shows a top view of an integrated circuit 200 in accordance with some embodiments. Like FIG. 1's IC, FIG. 2's IC 200 includes first and second FinFETs 202, 204. The first FinFET 202 includes two active fin regions 206, 208 extending in a first direction with a gate dielectric and first gate electrode 210 extending thereover. On one side of the first gate electrode 210a, a source contact S1 electrically couples source regions in the active fin regions 206, 208 to one another, while on the other side of the first gate electrode 210b a drain contact D1 electrically couples drain regions in the active fin regions 206, 208 to one another. Thus, even though the first FinFET 202 includes two separate active fin regions 206, 208, the fact that the same first gate electrode 210 overlies these active fin regions makes the two active fin regions 206, 208 act as a single body for the first FinFET 202 in many respects. Although two separate active fin regions are illustrated, any number of separate active fin regions can be present and can underlie the gate dielectric and first gate electrode 210 and can be coupled to one another via one or more source contacts and/or drain contacts.

Similarly, the second FinFET 204 also includes two active fin regions 212, 214 extending in the first direction with a gate dielectric and second gate electrode 216 extending thereover. On one side of the second gate electrode 216a, a source contact S2 electrically couples source regions in the active fin regions 212, 214 to one another, while on the other side of the gate electrode 216b a drain contact D2 electrically couples drain regions in the active fin regions 212, 214 to one another. Thus, even though the second FinFET 204 includes two separate active fin regions 212, 214, the fact that the same second gate electrode 216 overlies these active fin regions makes the two active fin regions 212, 214 act as a single body for the second FinFET 204 in many respects. Although two separate active fin regions are illustrated, any number of separate active fin regions can be present and underlie the gate dielectric and second gate electrode 216 and can be coupled to one another via one or more source contacts and/or drain contacts.

The first and second gate electrodes 210, 216 are electrically coupled to one another at an interface 218, and are made of different metals having different work functions. The different metals, which can each be a refractory metal, can be selected to set the threshold voltages of the first and second FinFETs 202, 204 to meet the demands of a desired application.

Figure 3:
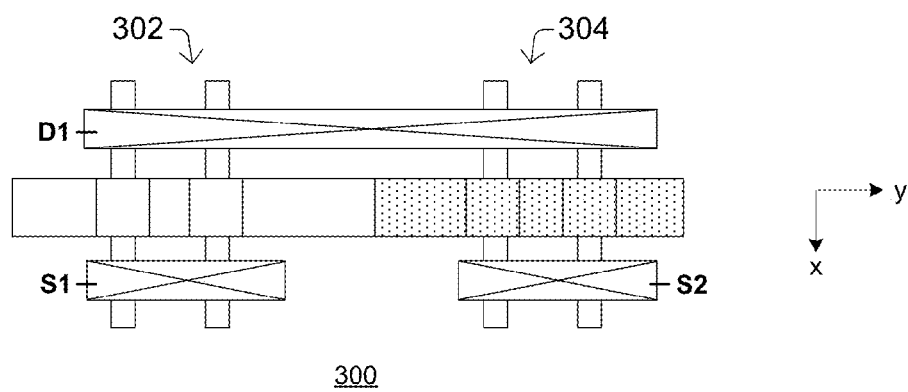
FIG. 3 shows a top view of some embodiments of FinFET devices with different metal gate electrodes and wherein two FinFET devices have a common drain.

FIG. 3 shows a top view of an integrated circuit 300 in accordance with some embodiments. Like FIG. 2's IC, FIG. 3's IC 300 includes first and second FinFETs 302, 304. Unlike FIG. 2's IC, which had separate drain regions D1, D2 for the first and second FinFETs 302, 304, FIG. 3's IC 300 has an elongated drain contact D1 that establishes a common drain for the first and second FinFETs. Although not illustrated, a common source contact could also be present in combination with or independent of the common drain contact.

Figure 4B:
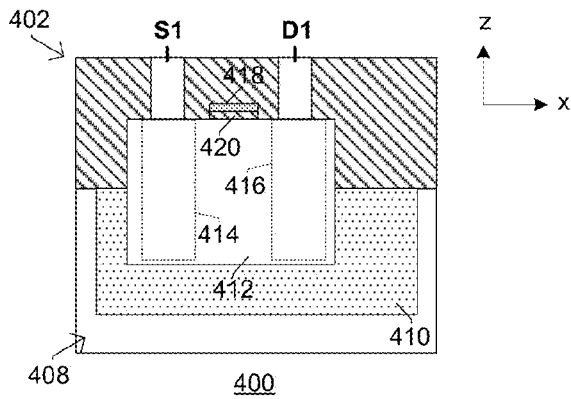
FIGS. 4A-4C show views of some embodiments of FinFET devices with different metal gate electrodes.
Figure 4A:
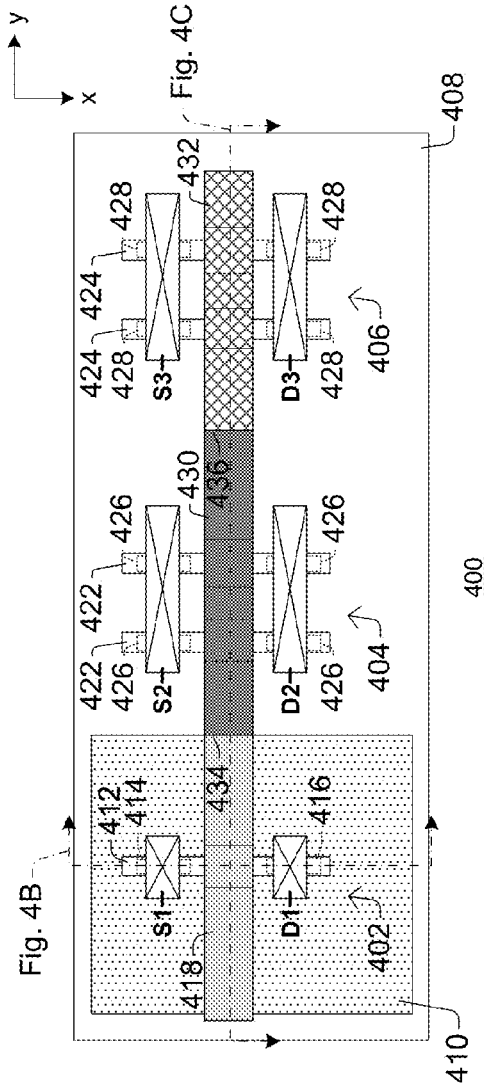
Figure 4C:
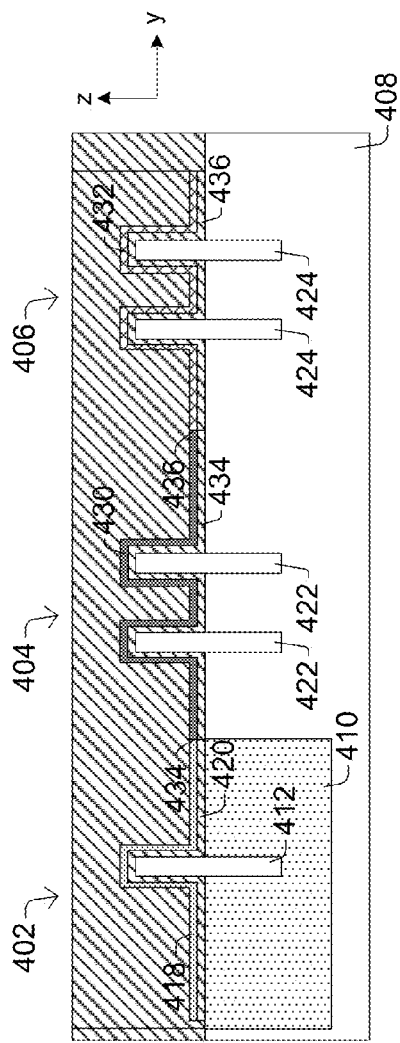

FIGS. 4A-4C, which are now discussed concurrently, show another embodiment of an IC 400 that makes use of different metals for gate electrodes for three FinFET devices 402-406. As indicated by the sectional lines in FIG. 4A's top view, FIG. 4B shows a cross-sectional view along a length of a first FinFET 402, and FIG. 4C shows a cross-sectional view taken laterally along the first, second, and third FinFETs 402-406. In the illustrated example, first FinFET 402 is now described as having a first conductivity type (e.g., p-type), while the second and third FinFETs (404, 406, respectively) are now described as each having a second conductivity type (e.g., n-type). It will be appreciated that the illustrated arrangement is not limiting and any arrangements of different conductivity type transistors also falls within this disclosure. For example, additional transistors can also be present, and the first conductivity type could alternatively be n-type and the second conductivity type could be p-type.

The FinFETs 402-406 are formed on a semiconductor substrate 408, which has the first conductivity type (e.g., p-type). It will be appreciated that "semiconductor substrate" as referred to in this disclosure may comprise any type of semiconductor material including a bulk silicon wafer, a binary compound substrate (e.g., GaAs wafer), a ternary compound substrate (e.g., AlGaAs), or higher order compound wafers, among others. Further, the semiconductor substrate 408 can also include non semiconductor materials such as oxide in silicon-on-insulator (SOI), partial SOI substrate, polysilicon, amorphous silicon, or organic materials, among others. In some embodiments, the semiconductor substrate 408 can also include multiple wafers or dies which are stacked or otherwise adhered together. The semiconductor substrate 408 can include wafers which are cut from a silicon ingot, and/or any other type of semiconductor/non-semiconductor and/or deposited or grown (e.g., epitaxial) layers formed on an underlying substrate.

The first FinFET 402 is formed within a well region 410 having the second conductivity type (e.g., n-well). A fin-like active fin region 412 of the first FinFET 402 has the second conductivity type, and source and drain regions 414, 416 having the first conductivity type (e.g., p-type) are then formed in the active fin region 412 about opposite sides of first gate electrode 418. A gate dielectric 420 separates the first gate electrode 418 from the active fin region 412 of the first FinFET.

The second and third FinFETs 404, 406 are established by fin-like active fin regions 422, 424 having the first conductivity type (e.g., p-type). Source/drain regions 426, 428, which have the second conductivity type (e.g., n-type), are then formed in the active fin regions about opposite sides of second gate electrode 430 and third gate electrode 432. Gate dielectrics 434, 436 separate the second and third gate electrodes 430, 432 from the active fin regions of the second and third FinFETs.

The first, second, and third gate electrodes 418, 430, 432 can each be made of a different metal and can each have different workfunctions from one another. Thus, the first gate electrode 418, which can have a first workfunction that tunes $V_T$ of first (e.g., p-type) FinFET 402, can meet the second gate electrode 430, which can have a second workfunction that tunes $V_T$ of second (e.g., n-type FinFET 404), at a first interface 434. The second gate electrode 430 can meet the third gate electrode 432, which can have a third workfunction that tunes $V_T$ of third (e.g., n-type FinFET 406), at a second interface 436. The first, second, and third gate electrodes 418, 430, 432 are all electrically coupled, and can for example be ohmically coupled with low resistances for the gate electrodes and junctions there between.) By selecting appropriate materials for the first, second, and third gate electrodes 418, 430, 434, the voltage thresholds of the first, second, and third FinFETs 402, 404, 406 can be tuned to achieve desired operating conditions.

Figure 5A:
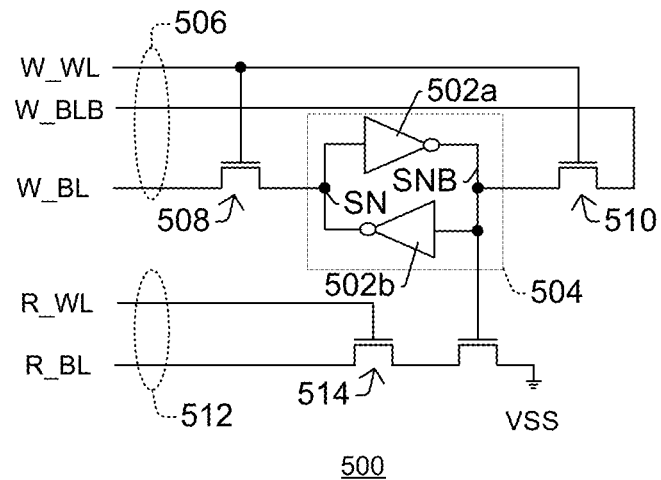
FIG. 5A shows a schematic view of some embodiments of a two-port SRAM.

FIG. 5A shows a schematic view of a two-port SRAM cell 500 that can use different metal gates to achieve improved performance. The two port SRAM cell 500 includes a data storage element 504 made up of cross-coupled inverters 502a, 502b having complementary storage nodes SN, SNB. As will be appreciated in more detail below, data values can be written to the data storage element 504 via a write port 506 through access transistors 508, 510. Data values can be read from the data storage element 504 via read port 512 through access transistor 514.

To write a data value to SRAM cell 500, biases corresponding to the desired data states are established on the complimentary write bitlines W_BLB and W_BL. For example, if a logical "1" is desired to be written to the cell 500, W_BL can be set to a high voltage (e.g., corresponding to a logical "1") and W_BLB can be set to a low voltage (e.g., corresponding to a logical "0"). When these write bitline voltages are applied, the write wordline W_WL is asserted, thereby coupling complimentary write bitlines W_BL, W_BLB to the first and second complimentary storage nodes SN, SNB. Hence, the biases on the complementary write bitlines are driven onto the storage nodes SN, SNB, which overwrites whatever previous state was stored in the cross-coupled inverters, thereby latching the desired data value in memory cell 500.

Figure 5B:
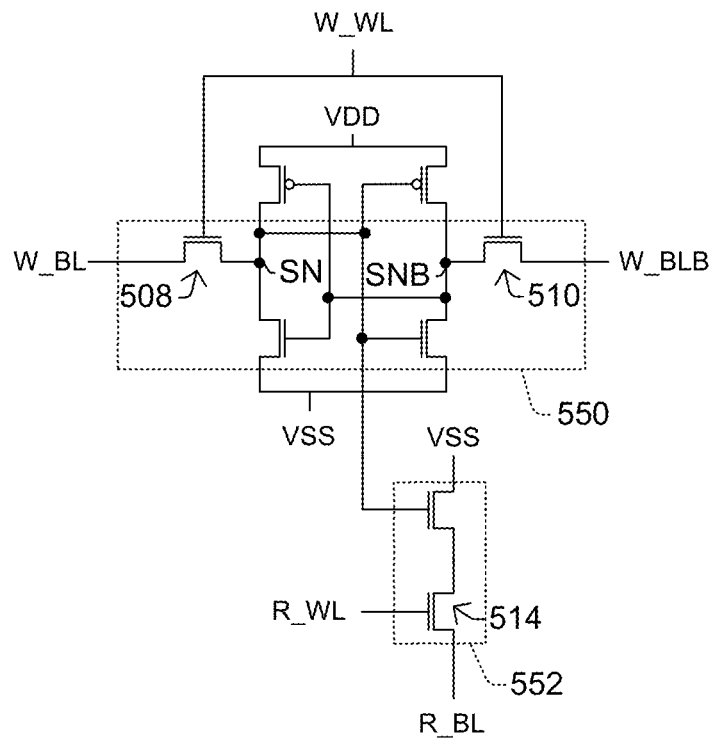
FIG. 5B shows a schematic view of some embodiments of a two-port SRAM.

FIG. 5B shows an equivalent SRAM cell 500, where the transistors of the cross-coupled inverters 502a, 502b have been explicitly depicted. The write port NMOS FinFETs 550 have gate electrodes that are formed by a first metal, and the read port NMOS FinFETs 552 have gate electrodes that are formed by a second, different metal. The first metal and second metal have different workfunctions.

By using at least two different work-function metals for these gate electrodes, the read port transistors 552 can have $V_T$'s in a first range while the write port transistors 550 can have $V_T$'s in a second range. The $V_T$'s of the write port FinFETs 550 can be set to a higher $V_T$ (higher $V_T$ can limit leakage), and the $V_T$'s of the read port FinFETs 552 can be set to a lower $V_T$ (faster read operations).

Figure 6:
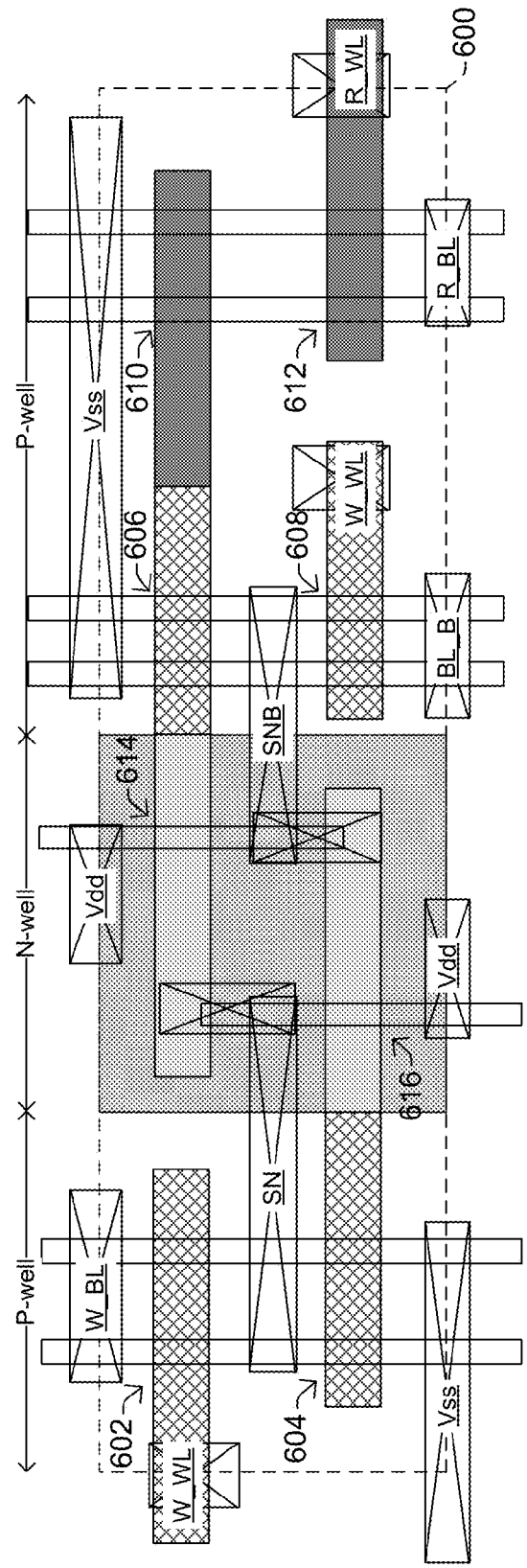
FIG. 6 shows a top (layout) view of some embodiments of a two-port SRAM library cell.

FIG. 6 shows a layout (top) view of a two port SRAM library cell 600 in accordance with some embodiments. Although FIG. 6 shows only a single SRAM library cell, it will be appreciated that an array of such cells can be tiled together to build an SRAM device. The transistors shown in FIG. 6, which are implemented as FinFETs, correspond to the circuit schematic of FIG. 5B. To show how these two figures correspond, FIG. 6 has been labeled so that like nodes are labeled similarly (e.g., write bitline W_BL in FIG. 5B is labeled as W_BL in FIG. 6). It will be appreciated, however, that nothing in the layout of FIG. 6 limits how the circuit of FIG. 5B could be laid out in other implementations.

Notably, FIG. 6's two port SRAM cell 600 contains six n-type finFETs (602, 604, 606, 608, 610, 612) and two p-type finFETs (614, 616). Of the six n-type FinFETs, four (602, 604, 606, 608) have gate electrodes made of a first metal having a first workfunction. The other two n-type FinFETs (610, 612) have gate electrodes made of a second metal having a second workfunction. The two p-type transistors have a gate electrodes made of a third metal having a third workfunction. Typically, the first metal induces a higher $V_T$ for the first four n-type FinFETs (602, 604, 606, 608), while the second metal induces a lower $V_T$ for the two remaining n-type FinFETs (610, 612). Because of this, the write port of the SRAM cell can be written to with lower leakage, while the read port provides faster read operations due to the lower $V_T$.

In some embodiments, the first metal can be a refractory metal and chosen from the following group of metals: TaN, TiN, TaAl, TiAl, Al, or W. The final work-function metal structure for the first metal is often a compound material that is selected from the above listed materials, wherein each layer can have a different thickness (e.g., in the range of 5 A~50 A) and each layer can be repeated. In some embodiments, the second metal can be a refractory metal and chosen from the following group of metals: TaN, TiN, TaAl, TiAl, Al, or W. The final work-function metal structure for the second metal is often a compound material that is selected from the above-listed materials, wherein each layer can have a different thickness (e.g., in the range of 5 A~50 A) and each layer can be repeated. In some embodiments, the third metal can be a refractory metal and chosen from the following group of metals: TaN, TiN, TaAl, TiAl, Al, or W.

Figure 7:
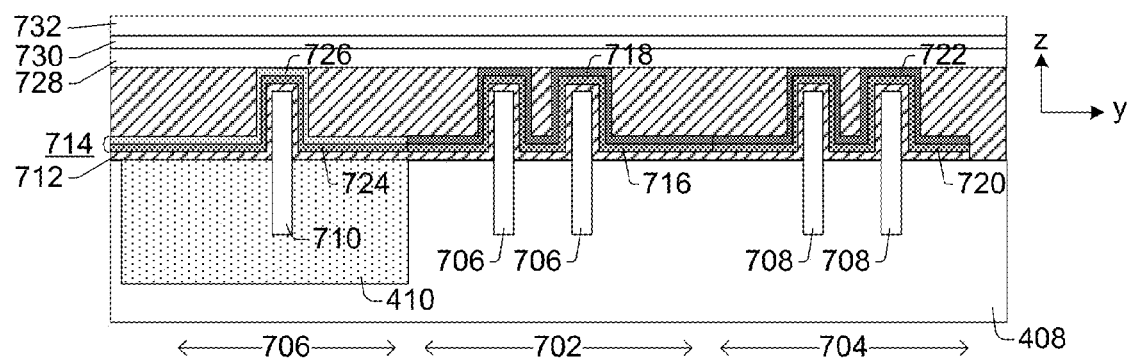
FIG. 7 shows some embodiments of a cross-sectional view of FinFET devices with different metal gate electrodes.

FIG. 7 shows a more detailed example 700 where compound materials are used to achieve different workfunctions for the FinFETs of the same conductivity type. FIG. 7's example again shows three FinFETs 702, 704, 706. First and second FinFETs 702, 704, which are n-type are formed in p-type active fin regions 706, 708, and a third FinFET 706, which is p-type is formed in an n-type active fin region 710. A gate dielectric layer 712, which is typically a high-K dielectric material, separates conductive gate electrodes 714 of the FinFETs from the underlying active fin regions. The gate electrodes are made of compound materials with different workfunctions to tune the VTs of the FinFETs. More particularly, the first n-type FinFET 702 has a gate electrode with first and second layers 716, 718. The first layer 716 can be a TaN (or TiN) layer having a thickness of approximately 5 A-20 A, while the second layer 718 can be a TiAl, TiAL2, or TiAL3N layer having a thickness of approximately 10 A-40 A. The second n-type FinFET 704 also has a gate electrode with first and second layers 720, 722. The first layer 720 can be a TaN (or TiN) layer having a thickness of approximately 5 A-20 A, while the second layer 722 can be a TiAl3~TiAl5 layer, or a TiAl4~TiAl8 layer having a thickness of approximately 10 A-40 A. The p-type FinFET 706 can have a first layer 724 of TaN, and a second layer 726 of TiN, although additional metal layers can also be present in this stack as well as the stacks of the n-type FinFETs. An additional metal layer 728 is then formed over the gate electrodes. This additional metal 728 is selected from the group of TiN, TiAl, TiAlN, TaN, TaAl, TaAlN, or TaCN. The major difference between the VTs for the first and second n-type FinFETs is the Al content. The material for the lower VT FinFET has higher Al content for the TaAl or TiAl compound. A barrier metal layer 730, which can comprise TiN at a thickness of 10 A-40 A, is then formed over the additional metal layer 728. A low resistance metal layer 732, which can comprise W or Al at a thickness of 50 A-1000 A, is then formed over the barrier metal layer 730.

Thus, it will be appreciated that some embodiments relate to an integrated circuit including fin field effect transistors (FinFETs) thereon. The integrated circuit includes first and second active fin regions having a first conductivity type and spaced apart from one another. A gate dielectric layer is disposed over the first and second active fin regions. First and second gate electrodes are disposed over the first and second active fin regions, respectively. The first and second gate electrodes are also disposed over the gate dielectric layer. The first and second gate electrodes are electrically coupled together and are electrically separated from the first and second active fin regions by the gate dielectric layer. The first gate electrode is made of a first metal having a first workfunction, and the second gate electrode is made of a second metal having a second work function that differs from the first workfunction.

Other embodiments relate to an integrated circuit that includes first, second, and third active fin regions separated from one another. First and second n-type FinFETs having first and second metal gate electrodes, respectively, are formed on the first and second active fin regions, respectively. A third p-type FinFET having a third metal gate electrode is formed on the third active fin region. The first, second, and third metal gate electrodes are operably coupled, and a dielectric layer over the first, second, and third active fin regions separates the first, second, and third active fin regions from the first, second, and third metal gate electrodes, respectively. The first, second, and third metal gate electrodes are made of first, second, and third metals, respectively, which each have a different work function from the one another.

A static random access memory (SRAM) device includes a data storage element made up of cross-coupled inverters that cooperatively store a data state therein. A write port of the SRAM device writes data values to the memory storage element, and a read port of the memory cell reads data values from the memory storage element. Write port FinFET devices of a first conductivity type have gate electrodes made of a first metal. Read port FinFET devices of the first conductivity type have gate electrodes made of a second metal. The workfunction of the first metal differs from that of the second metal.

Although the disclosure has been shown and described with respect to one or more implementations, equivalent alterations and modifications will occur to others skilled in the art based upon a reading and understanding of this specification and the annexed drawings. For example, it will be appreciated that identifiers such as "first" and "second" do not imply any type of ordering or placement with respect to other elements; but rather "first" and "second" and other similar identifiers are just generic identifiers. In addition, it will be appreciated that the term "coupled" includes direct and indirect coupling. The disclosure includes all such modifications and alterations and is limited only by the scope of the following claims. In particular regard to the various functions performed by the above described components (e.g., elements and/or resources), the terms used to describe such components are intended to correspond, unless otherwise indicated, to any component which performs the specified function of the described component (e.g., that is functionally equivalent), even though not structurally equivalent to the disclosed structure which performs the function in the herein illustrated exemplary implementations of the disclosure. In addition, while a particular feature of the disclosure may have been disclosed with respect to only one of several implementations, such feature may be combined with one or more other features of the other implementations as may be desired and advantageous for any given or particular application. In addition, the articles "a" and "an" as used in this application and the appended claims are to be construed to mean "one or more".

Furthermore, to the extent that the terms "includes", "having", "has", "with", or variants thereof are used in either the detailed description or the claims, such terms are intended to be inclusive in a manner similar to the term "comprising."

What is claimed is:

1. An integrated circuit including fin field effect transistors (FinFETs) thereon, comprising:
    first and second active fin regions having a first conductivity type and spaced apart from one another;
    a third active fin region having a second conductivity type that is opposite the first conductivity type;
    a gate dielectric layer disposed over the first, second, and third active fin regions; and
    first and second gate electrodes disposed over the first and second active fin regions, respectively, and disposed over the gate dielectric layer, wherein the first and second gate electrodes are electrically coupled together and are electrically separated from the first and second active fin regions by the gate dielectric layer;
    a third gate electrode disposed over the third active fin region and over the gate dielectric layer, wherein the third gate electrode is electrically separated from the third active fin region by the gate dielectric layer;
    wherein the first gate electrode is made of a first metal having a first workfunction, the second gate electrode is made of a second metal having a second work function that differs from the first workfunction, and the third gate electrode is a third metal that differs from the first and second metals.

2. The integrated circuit of claim 1, wherein the gate dielectric layer is a high-K dielectric.

3. The integrated circuit of claim 1, wherein the first and second metals are refractory metals.

4. The integrated circuit of claim 1, wherein the first and second gate electrodes are physically coupled together.

5. The integrated circuit of claim 4, wherein the first and second gate electrodes extend in linear fashion towards one another and abut one another at an interface.

6. The integrated circuit of claim 1, wherein the first metal of the first gate electrode induces a first FinFET corresponding to the first active fin region to have a first threshold voltage, and wherein the second metal of the second gate electrode induces a second FinFET corresponding to the second active fin region to have a second threshold voltage.

7. The integrated circuit of claim 6, wherein the first voltage threshold is higher than the second voltage threshold.

8. The integrated circuit of claim 6, wherein the first FinFET corresponds to a write port of a static random access memory (SRAM) cell, and wherein the second FinFET corresponds to a read port of the SRAM cell.

9. An integrated circuit, comprising:
    first, second, and third active fin regions separated from one another, wherein first and second n-type FinFETs having first and second metal gate electrodes, respectively, are formed on the first and second active fin regions, respectively, and wherein a third p-type FinFET having a third metal gate electrode is formed on the third active fin region, wherein the first, second, and third metal gate electrodes are operably coupled; and
    a dielectric layer over the first, second, and third active fin regions and separating the first, second, and third active fin regions from the first, second, and third metal gate electrodes, respectively;
    wherein the first, second, and third metal gate electrodes are made of first, second, and third metals, respectively, which each have a different work function from one another.

10. The integrated circuit of claim 9, wherein the dielectric layer is a high-K dielectric for the first, second, and third FinFETs.

11. The integrated circuit of claim 9, wherein the first, second, and third metals are refractory metals.

12. The integrated circuit of claim 9, wherein the first n-type FinFET corresponds to a write port of a static random access memory (SRAM) cell, and wherein the second n-type FinFET corresponds to a read port of the SRAM.

13. The integrated circuit of claim 12, wherein the first metal of the first metal gate electrode induces the first n-type FinFET to have a first threshold voltage and wherein the second metal of the second metal gate electrode induces the second n-type FinFET to have a second threshold voltage.

14. The integrated circuit of claim 13, wherein the first voltage threshold is higher than the second voltage threshold.

15. A static random access memory (SRAM) device, comprising:
    a memory cell including a data storage element made up of cross-coupled inverters that cooperatively store a data state therein;
    a write port to write data values to the data storage element; and
    a read port to read data values from the data storage element;
    wherein write port FinFET devices of a first conductivity type have gate electrodes made of a first metal, and wherein read port FinFET devices of the first conductivity type have gate electrodes made of a second metal, the workfunction of the first metal differing from that of the second metal.

16. The SRAM of claim 15, wherein the cross-coupled inverters include FinFET devices of a second conductivity type, and wherein the FinFET devices of the second conductivity type have gate electrodes that are made of a third metal having a workfunction that differs from that of the first and second metals.

17. The SRAM of claim 15:
wherein the first metal induces the write port FinFET devices of the first conductivity type to have a first threshold voltage,
wherein the second metal induces the read port FinFET devices of the first conductivity type to have a second threshold voltage, the second voltage threshold being lower than the first voltage threshold.

18. The SRAM of claim 15, wherein the first metal is a compound material made up of multiple refractory metal layers chosen from the following group: TaN, TiN, TaAl, TiAl, Al, or W, wherein each refractory metal layer in the first metal has a thickness of between 5 angstroms and 50 angstroms.

19. The SRAM of claim 18, wherein the second metal is a compound material made up of multiple refractory metal layers chosen from the following group: TaN, TiN, TaAl, TiAl, Al, or W, wherein each layer of the second metal has a thickness of between 5 angstroms and 50 angstroms.

20. An integrated circuit including fin field effect transistors (FinFETs) thereon, comprising:
first and second active fin regions having a first conductivity type and spaced apart from one another;
a gate dielectric layer disposed over the first and second active fin regions; and
first and second gate electrodes disposed over the first and second active fin regions, respectively, and disposed over the gate dielectric layer, wherein the first and second gate electrodes are electrically coupled together and are electrically separated from the first and second active fin regions by the gate dielectric layer;
wherein the first gate electrode is made of a first metal having a first workfunction, and the second gate electrode is made of a second metal having a second work function that differs from the first workfunction;
wherein the first metal of the first gate electrode induces a first FinFET corresponding to the first active fin region to have a first threshold voltage, and wherein the second metal of the second gate electrode induces a second FinFET corresponding to the second active fin region to have a second threshold voltage, wherein the first voltage threshold is higher than the second voltage threshold.

* * * * *